United States Patent
Ptasinski et al.

(10) Patent No.: US 9,941,136 B1
(45) Date of Patent: Apr. 10, 2018

(54) BACK END OF LINE (BEOL) METHOD FOR POLYMER AND BIPHENYL CLADDINGS

(71) Applicant: SPAWAR Systems Center Pacific, San Diego, CA (US)

(72) Inventors: Joanna N. Ptasinski, San Diego, CA (US); Stephen D. Russell, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 15/340,801

(22) Filed: Nov. 1, 2016

(51) Int. Cl.
| | |
|---|---|
| *H01L 21/306* | (2006.01) |
| *H01L 21/308* | (2006.01) |
| *H01L 21/02* | (2006.01) |
| *H01L 23/373* | (2006.01) |
| *H01L 21/027* | (2006.01) |

(52) U.S. Cl.
CPC ...... *H01L 21/3081* (2013.01); *H01L 21/0273* (2013.01); *H01L 21/02118* (2013.01); *H01L 21/30604* (2013.01); *H01L 23/3737* (2013.01)

(58) Field of Classification Search
CPC ........... H01L 21/3213; H01L 21/30621; H01L 21/31133
See application file for complete search history.

(56) References Cited

U.S. PATENT DOCUMENTS

| | | | |
|---|---|---|---|
| 5,264,693 A | 11/1993 | Shimabukuro et al. | |
| 7,980,145 B2 * | 7/2011 | Harish | G01L 1/142 324/660 |
| 9,082,881 B1 | 7/2015 | Hackler, Sr. et al. | |
| 2009/0261457 A1 * | 10/2009 | Pratt | H01L 21/76898 257/621 |

OTHER PUBLICATIONS

J, Ptasinski, L. Pang, I.C. Khoo, and Y. Fainman, K. Sung. NC 102778: Thermal stabilization method for silicon circuits.
J. Ptasinski, S.W. Kim, L. Pang, I.C. Khoo, and Y. Fainman, "Optical tuning of silicon photonis structures with nematic liquid crystal claddings," Optics Letters, vol. 38, Issue 12, pp. 2008-2010 (2013).
"Etch" http://www.me.ntut.edu.tw/introduction/teacher/lu/IC%20fabrication_GA/IC_ch09.pdf.
http://ieeexplore.ieee.org/stamp/stamp.jsp?arnumber=05898819.
"Dry Etching: Dry etch processes" http://www.halbleiter.org/en/dryetching/etchprocesses/?s=dry+etching+processes#suchanker.
Plasma Etching Outline (Phillip D. Rack) http:web.ulk.edu/~prack/Thin%20films/Etching.pdf.

* cited by examiner

*Primary Examiner* — Mohammad Choudhry
(74) *Attorney, Agent, or Firm* — SPAWAR Systems Center Pacific; Kyle Eppele

(57) ABSTRACT

A method is provided for creating a chamber on a semiconductor substrate, utilizing wet etching or dry etching, backfilling the chamber with a polymeric compound, and sealing the chamber.

19 Claims, 20 Drawing Sheets

BACK END OF LINE (BEOL) METHOD FOR POLYMER AND BIPHENYL CLADDINGS

STATEMENT OF GOVERNMENT INTEREST

Federally-Sponsored Research and Development

The United States Government has ownership rights in this invention. Licensing inquiries may be directed to Office of Research and Technical Applications, Space and Naval Warfare Systems Center, Pacific, Code 72120, San Diego, Calif., 92152; telephone (619)553-5118; email: ssc_pac_t2@navy.mil. Reference Navy Case No. 103081.

BACKGROUND OF THE INVENTION

Field of Invention

This disclosure relates to semiconductor fabrication, and more specifically, this disclosure relates to back end of line (BEOL) fabrication of integrated circuits.

Description of Related Art

The passive suppression of temperature sensitivity is an important consideration in silicon based chip-scale devices. For example, a negative thermo-optic coefficient (TOC) material may be used to offset silicon's high positive TOC. Materials used for thermal stabilization may include various polymers; however, the use of polymers is not compatible with current Complementary Metal-Oxide-Semiconductor (CMOS) processes.

BRIEF SUMMARY OF INVENTION

The present disclosure addresses the needs noted above by providing a method for creating a chamber on a semiconductor substrate, utilizing wet etching or dry etching, back-filling the chamber with a polymeric compound, and sealing the chamber.

These, as well as other objects, features and benefits will now become clear from a review of the following detailed description, the illustrative embodiments, and the accompanying drawings.

BRIEF DESCRIPTION OF DRAWINGS

The accompanying drawings, which are incorporated in and form a part of the specification, illustrate example embodiments and, together with the description, serve to explain the principles of the invention. In the drawings.

DETAILED DESCRIPTION OF THE INVENTION

Figure 1:
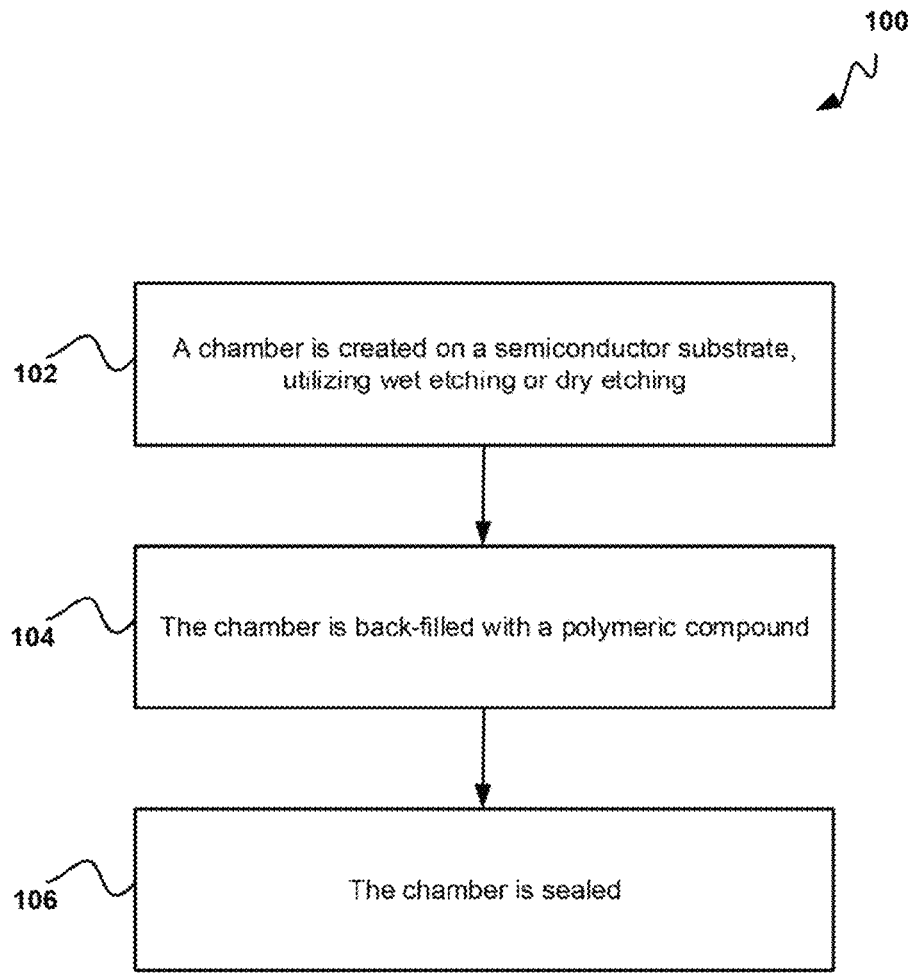
FIG. 1 illustrates a back end of line (BEOL) method for creating polymer and biphenyl claddings, according to one embodiment.

FIG. 1 illustrates a back end of line (BEOL) method 100 for creating polymer and biphenyl claddings, in accordance with one embodiment. As shown in operation 102, a chamber is created on a semiconductor substrate, utilizing wet etching or dry etching. In one embodiment, the semiconductor may include a complementary metal oxide semiconductor (CMOS). In another embodiment, creating the chamber utilizing dry etching may include forming a metal layer on top of the semiconductor substrate. For example, the metal layer may be formed over a silicon structure area patterned onto the semiconductor substrate.

Additionally, in one embodiment, creating the chamber utilizing dry etching may include spin coating a first photoresist layer onto the metal layer. For example, the first photoresist layer may be applied to the metal layer utilizing a spin coater. In another embodiment, creating the chamber utilizing dry etching may include removing a portion of the first photoresist layer to create a modified first photoresist layer, and subsequently removing one or more portions of the metal layer, according to the modified first photoresist layer.

Further, in one embodiment, creating the chamber utilizing dry etching may include depositing an outer layer onto the metal layer, and spin coating a second photoresist layer over the outer layer. In another embodiment, creating the chamber utilizing dry etching may include removing a portion of the second photoresist layer to create a modified second photoresist layer, and subsequently removing a portion of the outer layer, according to the modified second photoresist layer. In yet another embodiment, creating the chamber utilizing dry etching may include removing the second photoresist layer and the metal layer to create the chamber.

Further still, in one embodiment, creating the chamber utilizing wet etching may include forming a first metal layer on top of the substrate, and spin coating a first photoresist layer onto the first metal layer. In another embodiment, creating the chamber utilizing wet etching may include removing a portion of the first photoresist layer to create a modified first photoresist layer, and subsequently removing one or more portions of the metal layer, according to the modified first photoresist layer.

Also, in one embodiment, creating the chamber utilizing wet etching may include depositing a second metal layer onto the first metal layer, and spin coating a second photoresist layer over the second metal layer. In another embodiment, creating the chamber utilizing wet etching may include removing a portion of the second photoresist layer to create a modified second photoresist layer, and subsequently removing a portion of the second metal layer, according to the modified second photoresist layer.

In addition, in one embodiment, creating the chamber utilizing wet etching may include removing the second photoresist layer and depositing an outer layer onto the first metal layer and the second metal layer. In another embodiment, creating the chamber utilizing wet etching may include planarizing the surface of the outer layer. For example, the surface of the outer layer may be made planar utilizing chemical/mechanical polishing (CMP), which may remove a portion of, and also expose, the second metal layer. In yet another embodiment, creating the chamber utilizing wet etching may include removing the second metal layer and the first metal layer to create the chamber.

Furthermore, as shown in operation 104, the chamber is back-filled with a polymeric compound. In one embodiment, the polymeric compound may include one or more polymers (e.g., polymethyl methacrylate (PSQ-LH), Exguide LFR-372 available from ChemOptics, Inc. of Daejon, South Korea, etc.). In another embodiment, the polymeric compound may include a biphenyl or other negative thermo-optic materials. In yet another embodiment, the back-filling may be performed utilizing one or more micropipettes, utilizing electrowetting, etc.

Further still, as shown in operation 106, the chamber is sealed. In one embodiment, the chamber may be sealed utilizing wafer bonding. In another embodiment, the chamber may be sealed utilizing a flowable oxide. In yet another embodiment, the chamber may be sealed utilizing oxygen plasma. Of course, however, the chamber may be sealed utilizing any feasible method.

In this way, a chamber supporting polymers for thermal stabilization may be created utilizing a back end of line (BEOL) CMOS fabrication process.

Figure 2:
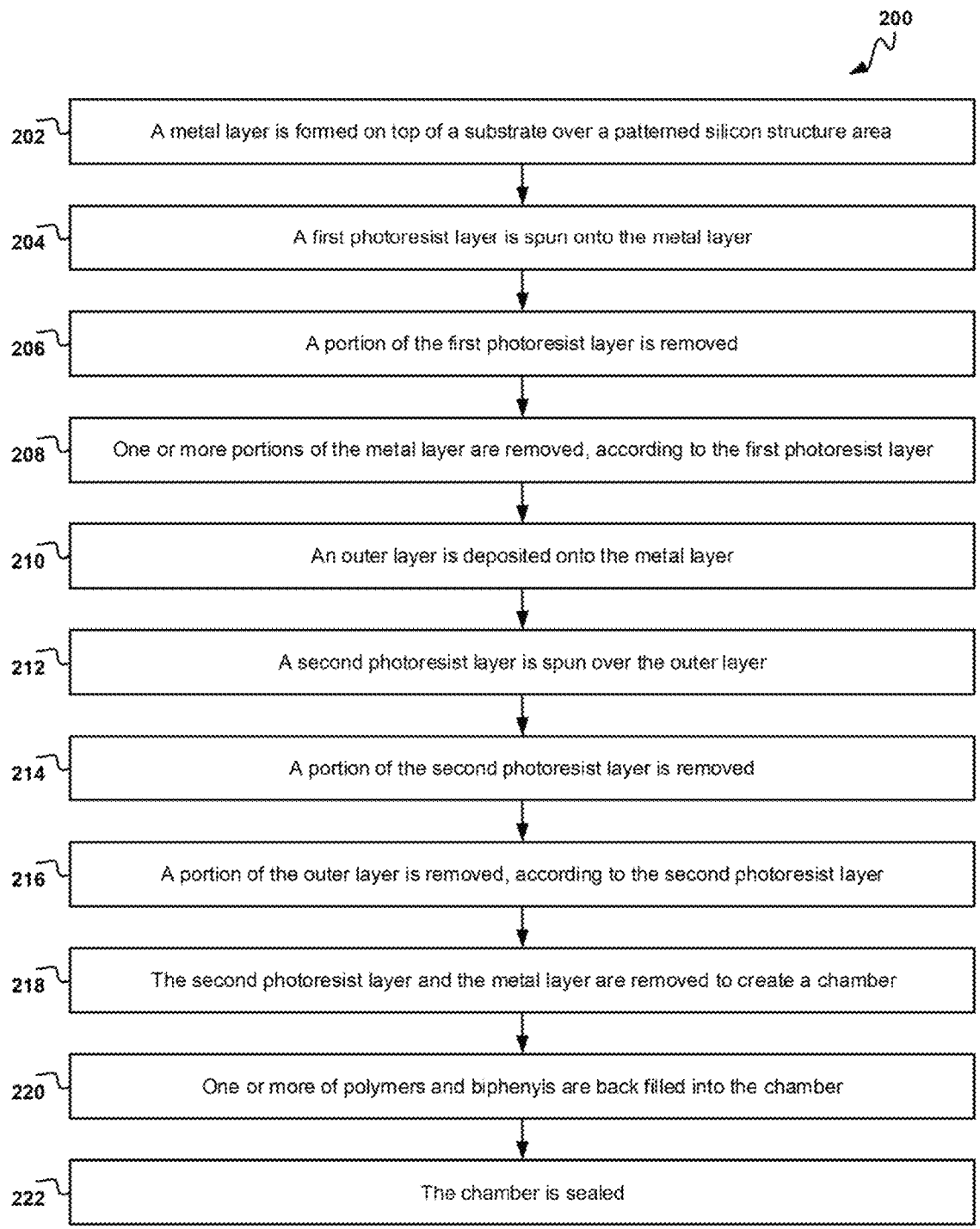
FIG. 2 illustrates an exemplary method for dry etching a chamber onto a substrate, according to another embodiment.

FIG. 2 illustrates an exemplary method 200 for dry etching a chamber onto a substrate, in accordance with one embodiment. As shown in operation 202, a metal layer is formed on top of a substrate over a patterned silicon structure area. In one embodiment, the substrate may include silicon on an insulating substrate including silicon dioxide (SiO2) or sapphire (Al2O3). In another embodiment, the substrate may include a buried oxide (BOX) layer. In yet another embodiment, the substrate and patterned silicon structure area may be part of a complementary metal oxide semiconductor (CMOS) or other electronic/photonic circuitry.

Additionally, in one embodiment, the patterned silicon structure area may include a silicon structure that is patterned onto the substrate (e.g., before the chamber is created, etc.). In another embodiment, the patterned silicon structure area may include one or more passive or active electronic or photonic components. In yet another embodiment, the patterned silicon structure area may include a passivation layer (e.g., to protect against subsequent processing, etc.).

Further, in one embodiment, the metal layer may be formed on top of the substrate over the patterned silicon structure area utilizing one or more application techniques (e.g., electron-beam or ebeam evaporation, sputtering, etc.). In another embodiment, the metal layer may have a predetermined height (e.g., 2-4 um, etc.). In yet another embodiment, the metal layer may include any metal used in CMOS processing, such as chromium (Cr), gold (Au), silver (Ag), nickel (Ni), aluminum (Al), etc.

Figure 4:
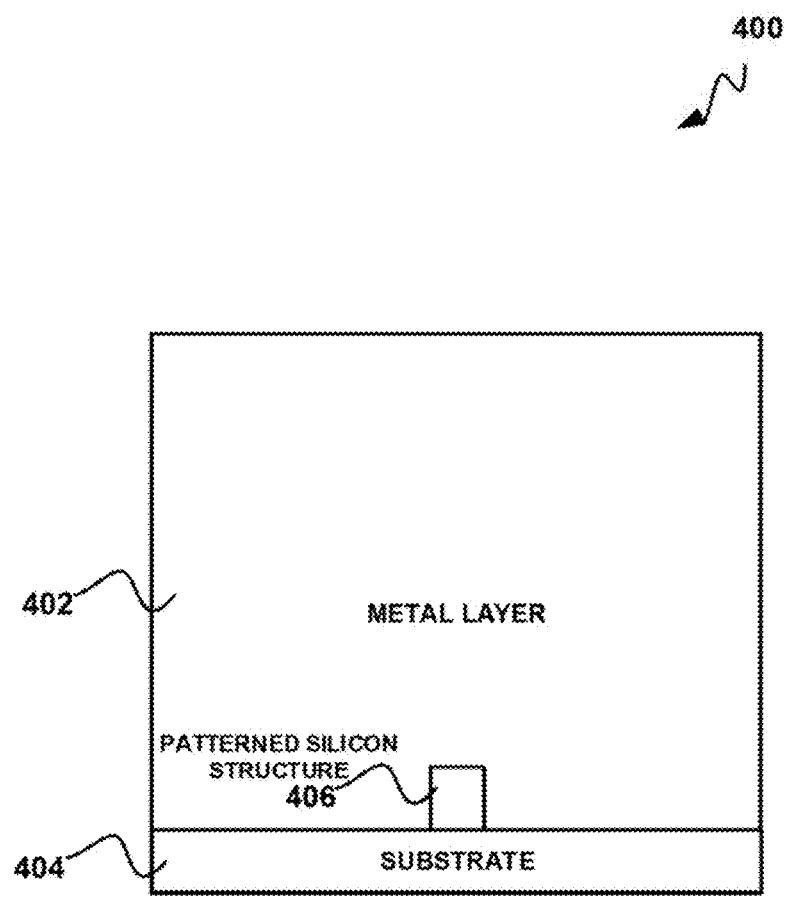
FIG. 4 illustrates an exemplary result of forming a metal layer onto a substrate and patterned silicon structure, according to another embodiment.

See, for example, FIG. 4, which illustrates an exemplary result 400 of forming a metal layer 402 onto a substrate 404 and patterned silicon structure 406.

Further still, as shown in operation 204, a first photoresist layer is spun onto the metal layer. In one embodiment, the photoresist layer may include a negative tone photoresist layer such as an epoxy based negative photoresist such as material sold under the name NANO™ SU-8 by Micro-Chem of Newton, Mass., or a negative e-beam resist such as the negative tone photo resist material ma-N 2403 sold by Micro Resist Technology Gmbh of Berlin, Germany), etc. In another embodiment, the photoresist layer may include a positive tone photoresist layer such as the Microposit™ S1805™, sold by Rhom and Haas of Philadelphia, Pa. or the AZ series photoresist sold by AZ Electronics of Luxembourg, a polymethyl methacrylate (PMMA) photoresist, etc.

Figure 5:
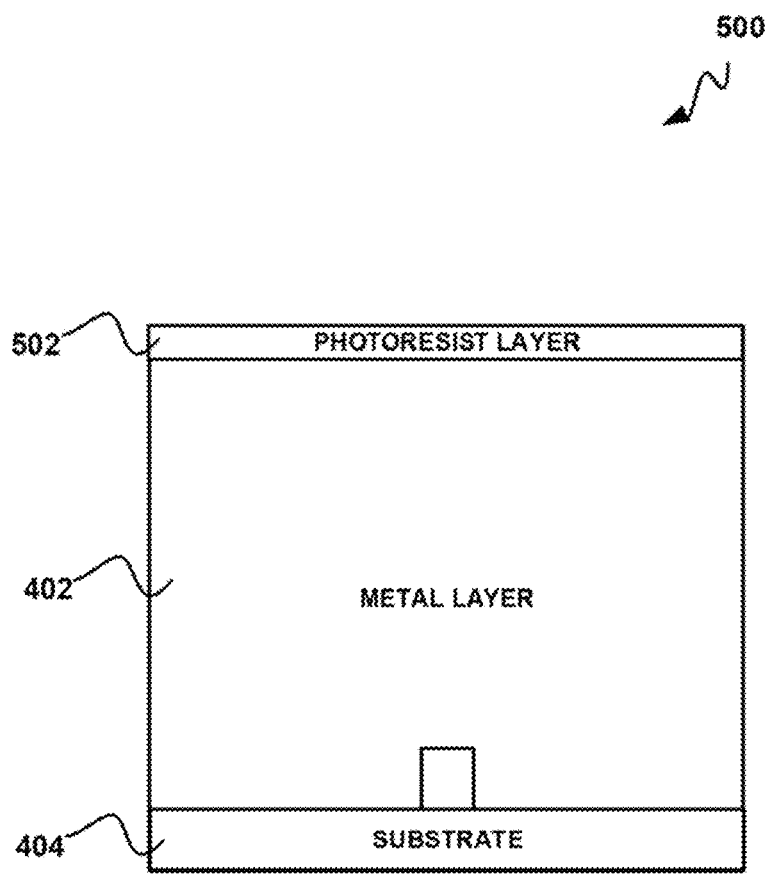
FIG. 5 illustrates an exemplary result of adding a photoresist layer to a metal layer, according to another embodiment.

See, for example, FIG. 5, which illustrates an exemplary result 500 of adding a photoresist layer 502 to the metal layer 402 shown in FIG. 4.

Also, as shown in operation 206, a portion of the first photoresist layer is removed. In one embodiment, the portion of the photoresist layer may be removed by exposing the photoresist layer in a mask aligner and developing the photoresist layer. In one embodiment, exposing and developing the photoresist layer may result in the removal of a portion of the photoresist layer to create a window pattern above the patterned silicon structure area. See, for example, FIG. 6, which illustrates an exemplary result 600 of removing portions 604A and 604B of photoresist layer 502 from FIG. 5 to create a modified photoresist layer 602.

In addition, as shown in operation 208, one or more portions of the metal layer are removed, according to the first photoresist layer. In one embodiment, portions of the metal layer not covered by the photoresist layer may be etched away. For example, wet etching or dry etching may be performed, where dry etching may be performed for a metal layer made of aluminum (Al), chromium (Cr), titanium (Ti), etc. In another embodiment, the remaining photoresist layer may be removed.

Figure 6:
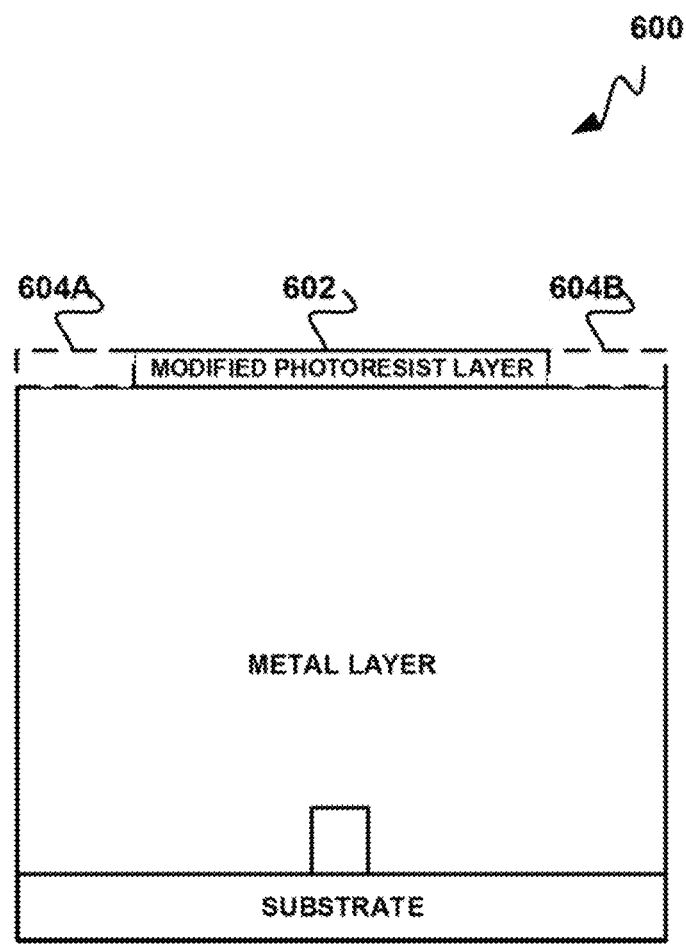
FIG. 6 illustrates an exemplary result of removing portions of a photoresist layer to create a modified photoresist layer, according to another embodiment.
Figure 7:
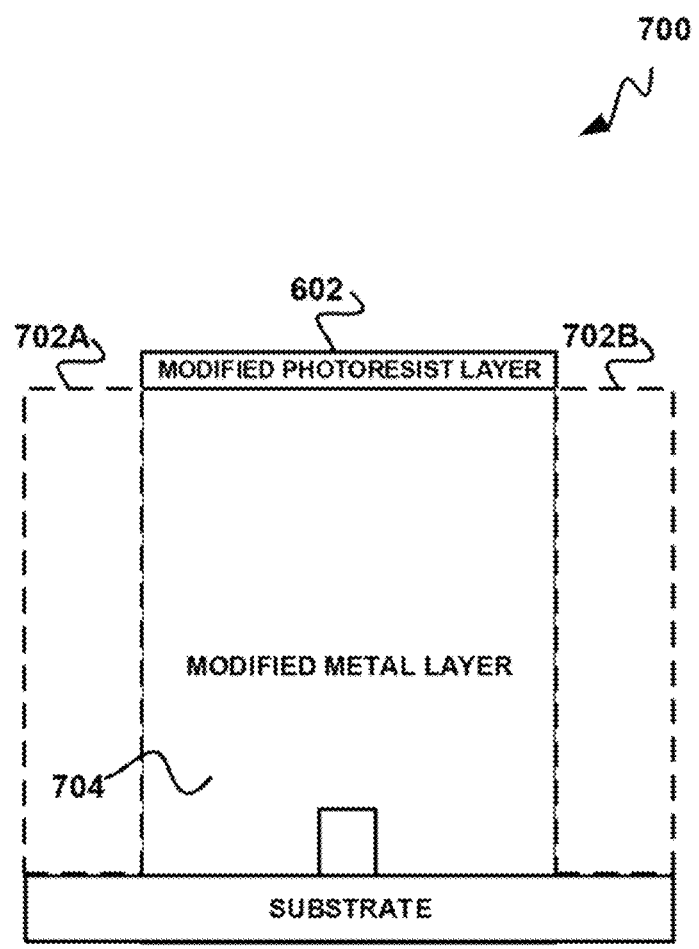
FIG. 7 illustrates an exemplary result of removing portions of a metal layer to create a modified metal layer, before removing a modified photoresist layer, according to another embodiment.

See, for example, FIG. 7, which illustrates an exemplary result 700 of removing portions 702A and 702B of metal layer 402 to create a modified metal layer 704, before removing the modified photoresist layer 602 from FIG. 6.

Figure 8:
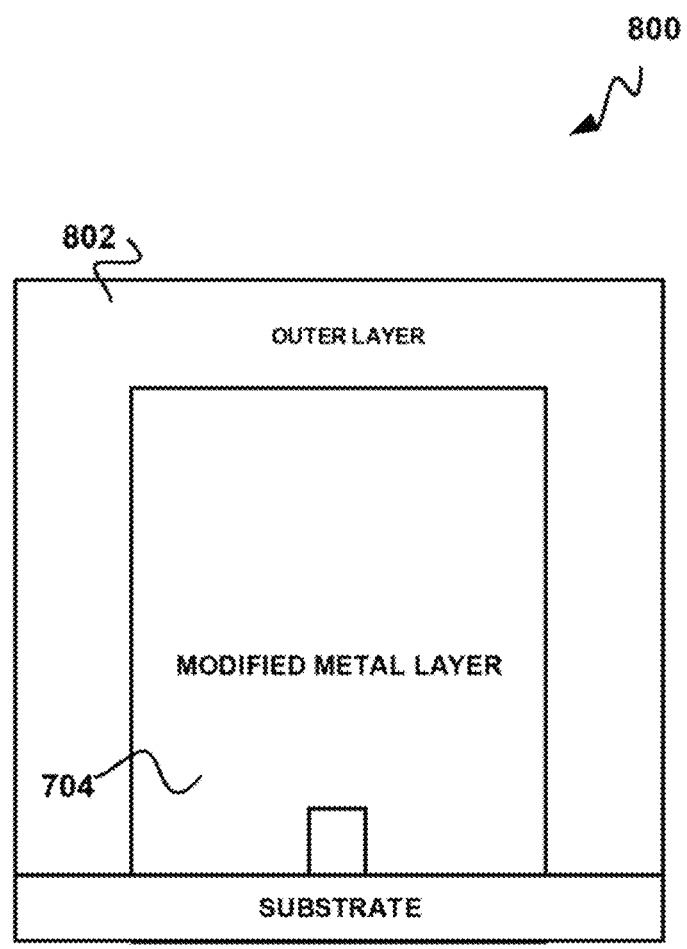
FIG. 8 illustrates an exemplary result of depositing an outer layer over a modified metal layer, according to another embodiment.

Furthermore, as shown in operation 210, an outer layer is deposited onto the metal layer. In one embodiment, the outer layer may include polycrystalline silicon (poly-Si), silicon nitride (Si3N4), silicon dioxide (SiO2), etc. In another embodiment, the outer layer may be deposited utilizing thermal oxidation, plasma-enhanced chemical vapor deposition (PECVD), chemical vapor deposition (CVD), etc. See, for example, FIG. 8, which illustrates an exemplary result 800 of depositing an outer layer 802 over the modified metal layer 704 from FIG. 7.

Further still, as shown in operation 212, a second photoresist layer is spun over the outer layer. In one embodiment, the photoresist layer may include a negative tone photoresist layer, a positive tone photoresist layer, etc. See, for example, FIG. 9, which illustrates an exemplary result 900 of spin coating a photoresist layer 902 over the outer layer 802 from FIG. 8.

Also, as shown in operation 214, a portion of the second photoresist layer is removed. In one embodiment, the portion of the photoresist layer may be removed by exposing the photoresist layer in a mask aligner and developing the photoresist layer. In one embodiment, exposing and developing the photoresist layer may result in the removal of a portion of the photoresist layer. In another embodiment, the removed portion may have a predetermined diameter (e.g., less than 1 mm or with a side of less than 1 mm for a rectangular structure, etc.). For example, the predetermined diameter of the removed portion may influence a fluid injection method, a final chamber sealing method, etc.

Figure 9:
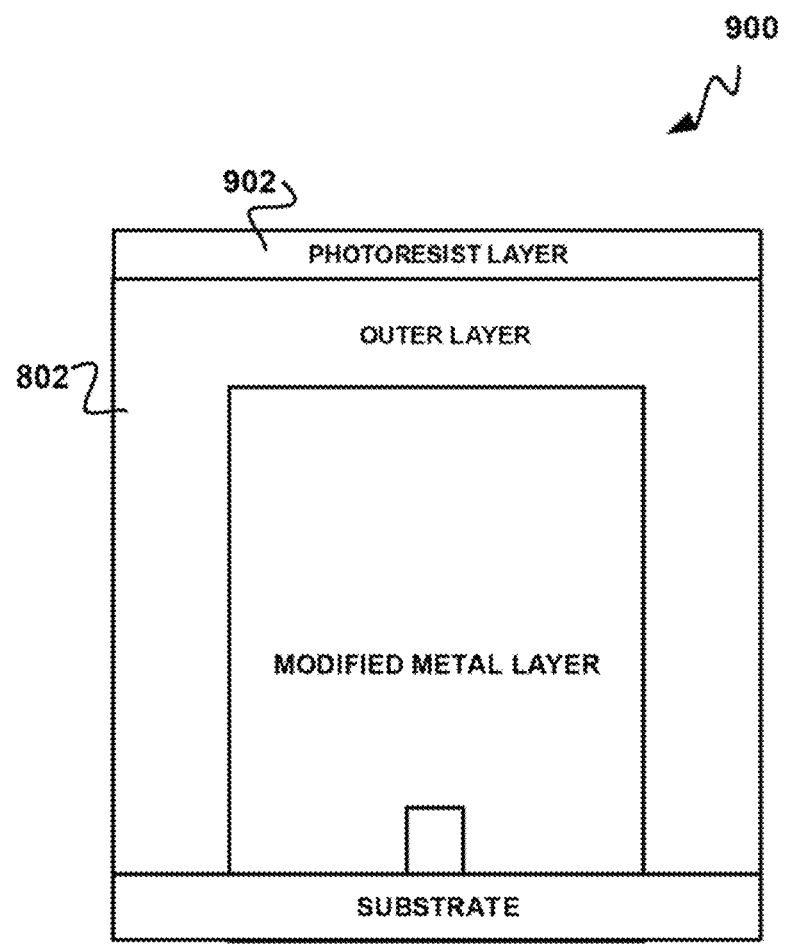
FIG. 9 illustrates an exemplary result of spin coating a photoresist layer over an outer layer, according to another embodiment.
Figure 10:
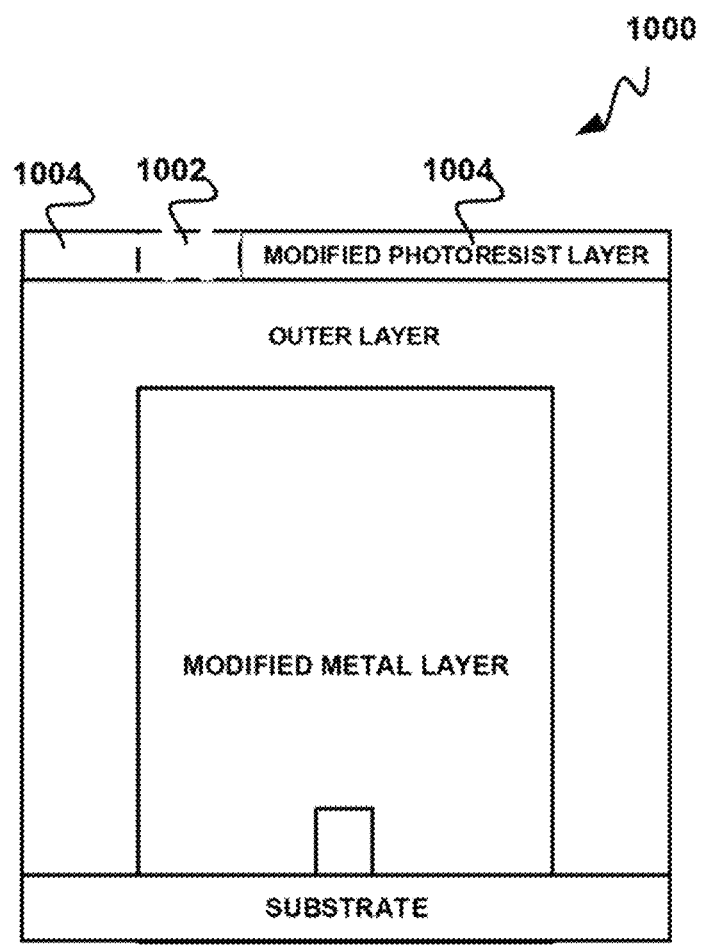
FIG. 10 illustrates an exemplary result of removing a portion of a photoresist layer to create a modified photoresist layer, according to another embodiment.

See, for example, FIG. 10, which illustrates an exemplary result 1000 of removing a portion 1002 of the photoresist layer 902 from FIG. 9 to create a modified photoresist layer 1004.

Figure 11:
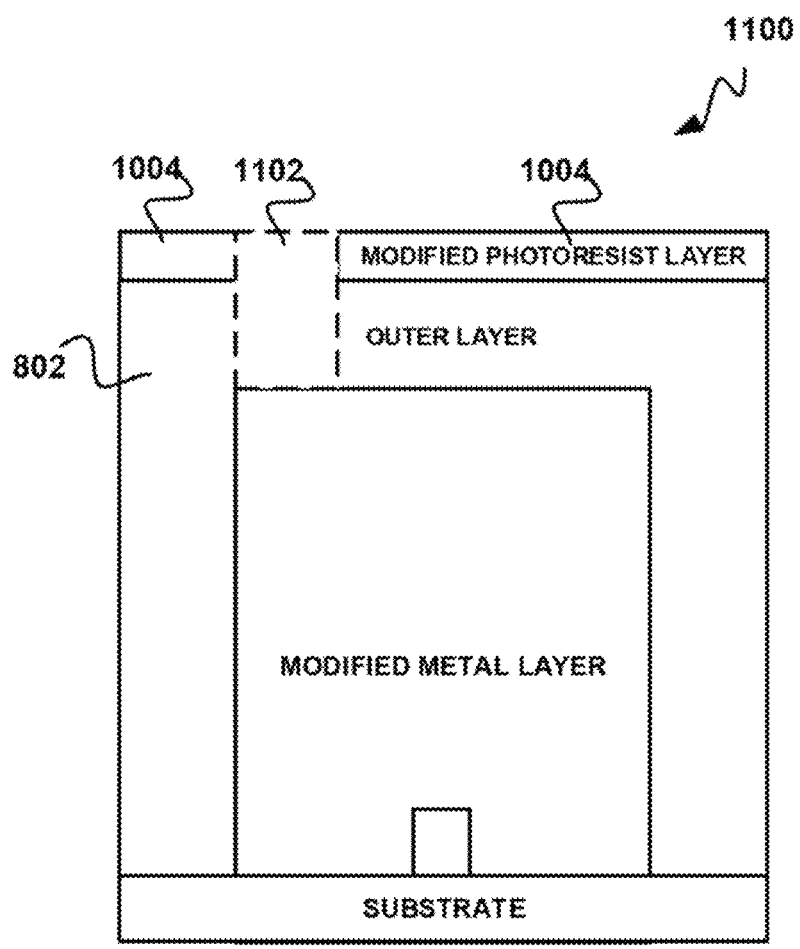
FIG. 11 illustrates an exemplary result of removing a portion of an outer layer, according to a modified photoresist layer, according to another embodiment.

Additionally, as shown in operation 216, a portion of the outer layer is removed, according to the second photoresist layer. In one embodiment, the portion of the outer layer may be removed utilizing an anisotropic dry etch. See, for example, FIG. 11, which illustrates an exemplary result 1100 of removing a portion 1102 of the outer layer 802, according to the modified photoresist layer 1004 from FIG. 10.

Additionally, Table 1 illustrates exemplary dry etch gas combinations, in accordance with one embodiment:

TABLE 1

| Material | Process Gasses | Annotation |
| --- | --- | --- |
| SiO$_2$, Si$_3$N$_4$ | CF$_4$, O$_2$ | F etches Si, O$_2$ removes carbon (C) |
| SiO$_2$, Si$_3$N$_4$ | CHF$_3$, O$_2$ | CHF$_3$ acts as polymer, enhanced selectivity on Si |
| SiO$_2$, Si$_3$N$_4$ | CHF$_3$, CF$_4$ | |
| SiO$_2$, Si$_3$N$_4$ | CH$_3$F | Enhanced selectivity of Si$_2$N$_4$ on SiO$_2$ |
| SiO$_2$, Si$_3$N$_4$ | C$_2$F$_6$/SF$_6$ | |
| SiO$_2$, Si$_3$N$_4$ | C$_3$F$_8$ | Enhanced etch rate compared to CF$_4$ |
| Poly-Si | BCl$_3$, CL$_2$ | No contamination with carbon (C) |
| Poly-Si | SiCl$_4$, CL$_2$ | |
| Poly-Si | HCl, O$_2$ | |
| Poly-Si | SiCl$_4$, HCl | |
| Poly-Si | O$_2$/SiCl$_4$, HCl | |
| Poly-Si | HBr/CL$_2$/O$_2$ | Enhanced selectivity on fotolack and SiO$_2$ |
| Poly-Si | SF$_6$ | High etch rate, fair selectivity on SiO$_2$ |
| Poly-Si | NF$_3$ | High etch rate, isotropic |
| Poly-Si | HBr, CL$_2$ | |

Further, as shown in operation 218, the second photoresist layer and the metal layer are removed to create a chamber. For example, the second photoresist layer may first be removed by developing the photoresist layer, and the metal layer may be removed utilizing wet etching or dry etching. In this way, the outer layer creates the chamber for polymers or biphenyls. See, for example, FIG. 12, which illustrates an exemplary result 1200 of removing the modified photoresist layer 1004 from FIG. 10 and the modified metal layer 704 from FIG. 7 to create a chamber 1202.

Further still, as shown in operation 220, one or more of polymers and biphenyls are back filled into the chamber. In one embodiment, the polymers and/or biphenyls may be back filled into the chamber utilizing micropipettes or other microfluidic transfer methods. In another embodiment, the polymers and/or biphenyls may be back filled into the chamber utilizing electrowetting. For example, one or more electrodes may be placed onto the CMOS during the fabrication process, and electrowetting may be implemented utilizing the electrodes.

Figure 12:
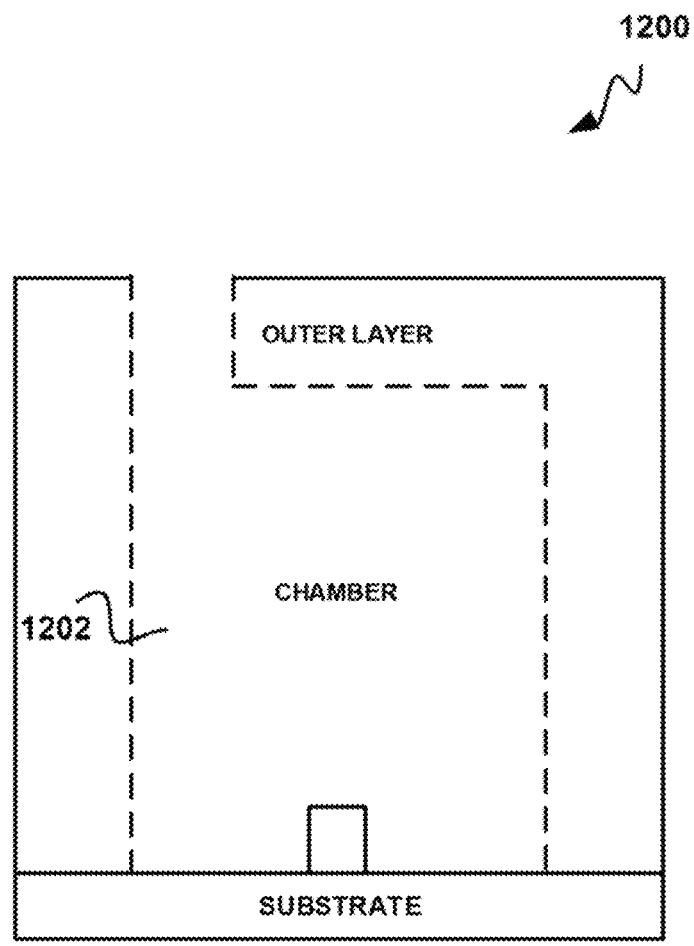
FIG. 12 illustrates an exemplary result of removing a modified photoresist layer and a modified metal layer to create a chamber, according to another embodiment.
Figure 13:
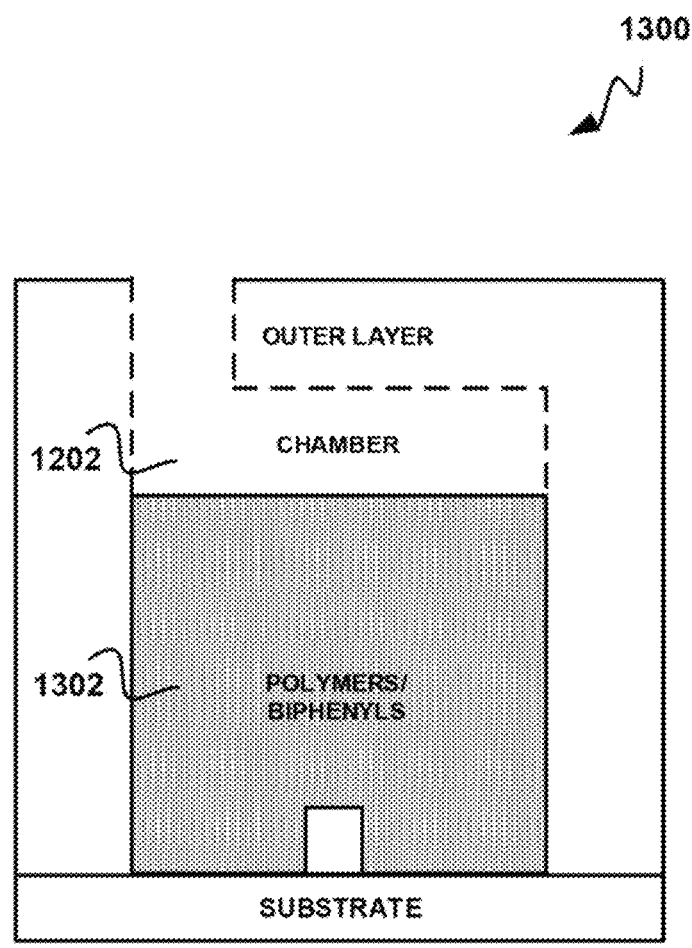
FIG. 13 illustrates an exemplary result of filling a chamber with polymers and/or biphenyls, according to another embodiment.

See, for example, FIG. 13, which illustrates an exemplary result 1300 of filling the chamber 1202 from FIG. 12 with polymers and/or biphenyls 1302.

Also, as shown in operation 222, the chamber is sealed. In one embodiment, the chamber may be sealed using room temperature silicon dioxide (SiO2) wafer bonding by an adhesion layer method. In another embodiment, the chamber may be sealed using a flowable oxide resist (such as FOX® 25 Flowable oxide sold by Dow Corning Corporation of Auburn, Mich. etc.) For example, the flowable oxide may be spun onto the top of the chamber (e.g., at a speed of 1000 RPM), exposed, and developed. In another example, the exposure may be an area exposure and may not require a mask. In yet another embodiment, the chamber may be sealed using room temperature oxygen plasma. In still another embodiment, using SiO2 wafer bonding or oxygen plasma sealing methods, the chamber may be sealed using a cover plate such as a microscope cover glass (e.g., having a thickness of 0.13-0.17 mm, etc.).

Figure 14:
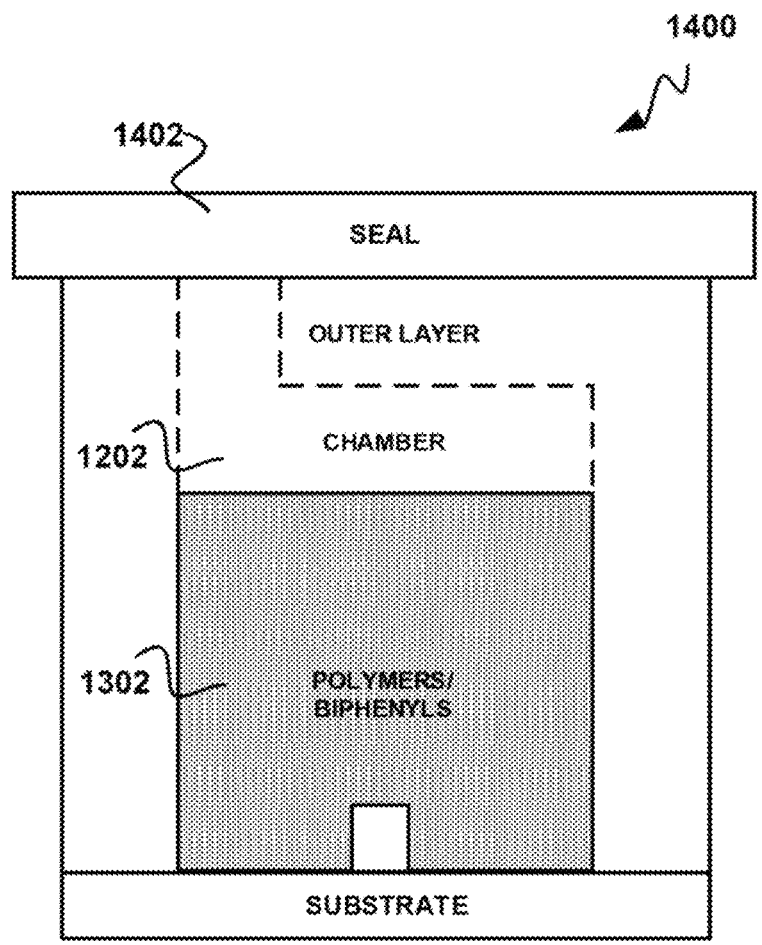
FIG. 14 illustrates an exemplary result of adding a seal to a chamber, according to another embodiment.

See, for example, FIG. 14, which illustrates an exemplary result 1400 of adding a seal 1402 to the chamber 1202 from FIG. 12.

In this way, dry etching may avoid photoresist adhesion problems, enable the etching of small features, and make anisotropic etch profiles possible. Additionally, chemical consumption may be reduced, reaction product disposal may be less costly, and a number of fabrication steps may be minimized. Further, dry etching may be suitable for automation, single wafer, and cassette to cassette applications.

Figure 3:
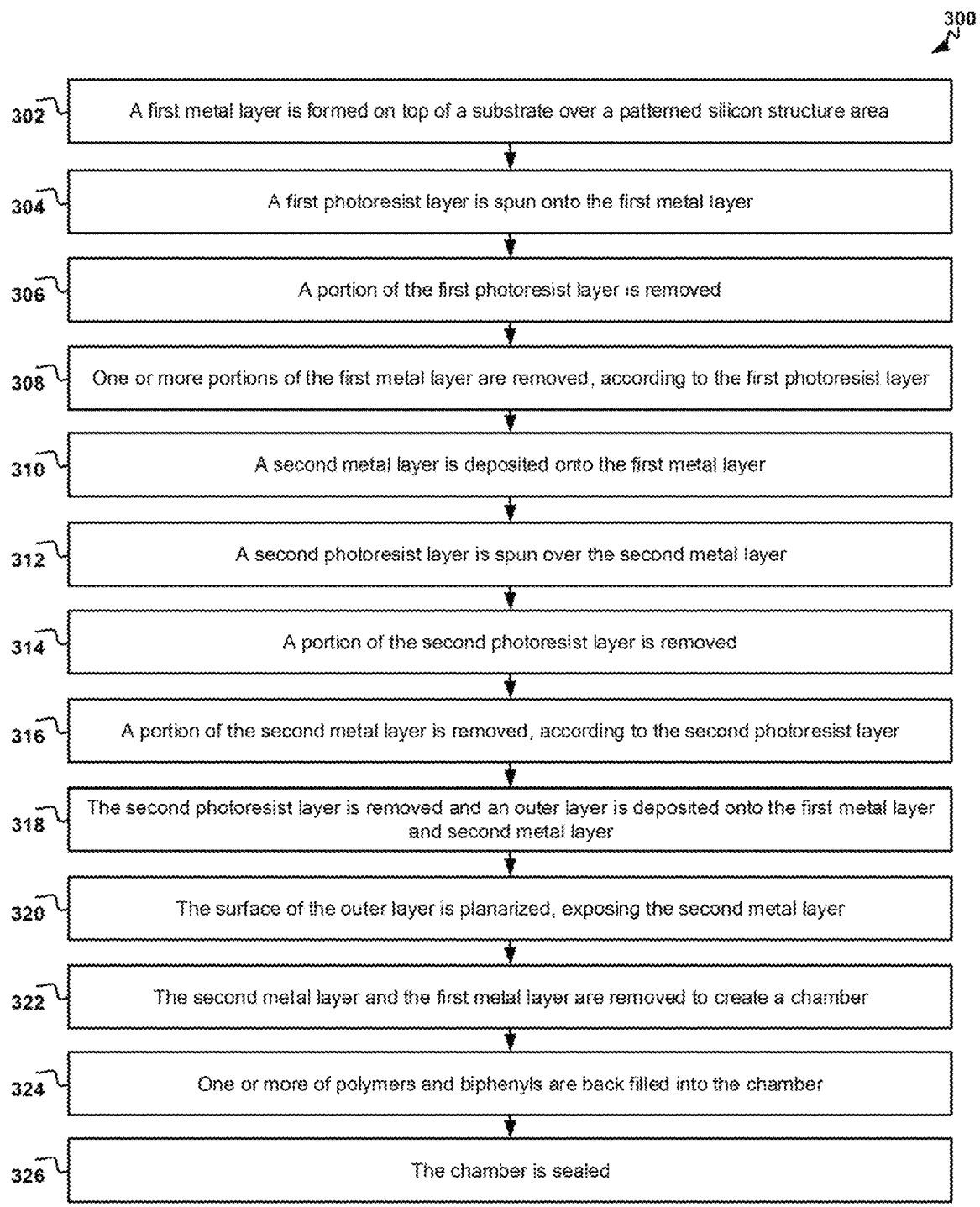
FIG. 3 illustrates an exemplary method for wet etching a chamber onto a substrate, according to another embodiment.

FIG. 3 illustrates an exemplary method 300 for wet etching a chamber onto a substrate, according to one embodiment. As shown in operation 302, a first metal layer is formed on top of a substrate over a patterned silicon structure area. In one embodiment, the substrate may include silicon on an insulating substrate including silicon dioxide (SiO2) or sapphire (Al2O3). In another embodiment, the substrate may include a buried oxide (BOX) layer. In yet another embodiment, the substrate and patterned silicon structure area may be part of a complementary metal oxide semiconductor (CMOS) or other electronic/photonic circuitry.

Additionally, in one embodiment, the patterned silicon structure area may include a silicon structure that is patterned onto the substrate (e.g., before the chamber is created, etc.). In another embodiment, the patterned silicon structure area may include one or more passive or active electronic or photonic components. In yet another embodiment, the patterned silicon structure area may include a passivation layer (e.g., to protect against subsequent processing, etc.).

Further, in one embodiment, the first metal layer may be formed on top of the substrate over the patterned silicon structure area utilizing one or more application techniques (e.g., ebeam evaporation, sputtering, etc.). In another embodiment, the metal layer may have a predetermined height (e.g., 2-4 um, etc.). In yet another embodiment, the metal layer may include any metal used in CMOS processing, such as chromium (Cr), gold (Au), silver (Ag), nickel (Ni), aluminum (Al), etc.

See, for example, FIG. 4, which illustrates an exemplary result 400 of forming a metal layer 402 onto a substrate 404 and patterned silicon structure 406.

Further still, as shown in operation 304, a first photoresist layer is spun onto the first metal layer. In one embodiment, the photoresist layer may include a negative tone photoresist layer such as an epoxy based negative photoresist such as material sold under the name NANO™ SU-8 by MicroChem of Newton, Mass., or a negative e-beam resist such as the negative tone photo resist material ma-N 2403 sold by Micro Resist Technology Gmbh of Berlin, Germany), etc. In another embodiment, the photoresist layer may include a positive tone photoresist layer such as the Microposit™ S1805™, sold by Rhom and Haas of Philadelphia, Pa. or the AZ series photoresist sold by AZ Electronics of Luxembourg, a polymethyl methacrylate (PMMA) photoresist, etc.

See, for example, FIG. 5, which illustrates an exemplary result 500 of adding a photoresist layer 502 to the metal layer 402 from FIG. 4.

Also, as shown in operation 306, a portion of the first photoresist layer is removed. In one embodiment, the portion of the photoresist layer may be removed by exposing the photoresist layer in a mask aligner and developing the photoresist layer. In one embodiment, exposing and developing the photoresist layer may result in the removal of a portion of the photoresist layer to create a window pattern above the patterned silicon structure area. See, for example, FIG. 6, which illustrates an exemplary result 600 of removing portions 604A and 604B of photoresist layer 502 from FIG. 5 to create a modified photoresist layer 602.

In addition, as shown in operation 308, one or more portions of the first metal layer are removed, according to the first photoresist layer. In one embodiment, portions of the metal layer not covered by the photoresist layer may be etched away. For example, wet etching or dry etching may be performed, where dry etching may be performed for a metal layer made of aluminum (Al), chromium (Cr), titanium (Ti), etc. In another embodiment, the remaining photoresist layer may be removed.

See, for example, FIG. 7, which illustrates an exemplary result 700 of removing portions 702A and 702B of metal layer 402 to create a modified metal layer 704, before removing the modified photoresist layer 602 from FIG. 6.

Furthermore, as shown in operation 310, a second metal layer is deposited onto the first metal layer. In one embodiment, the second metal layer may be different from the first metal layer (e.g., a different metal having an etchant with a high selectivity, etc.). For example, it may be able to etch the first metal layer without etching the second metal layer. In another embodiment, the second metal layer may be deposited utilizing ebeam evaporation, sputtering, etc. In another embodiment, the second metal layer may be deposited at a predetermined thickness (e.g., 10-20 um thick, etc.).

Figure 15:
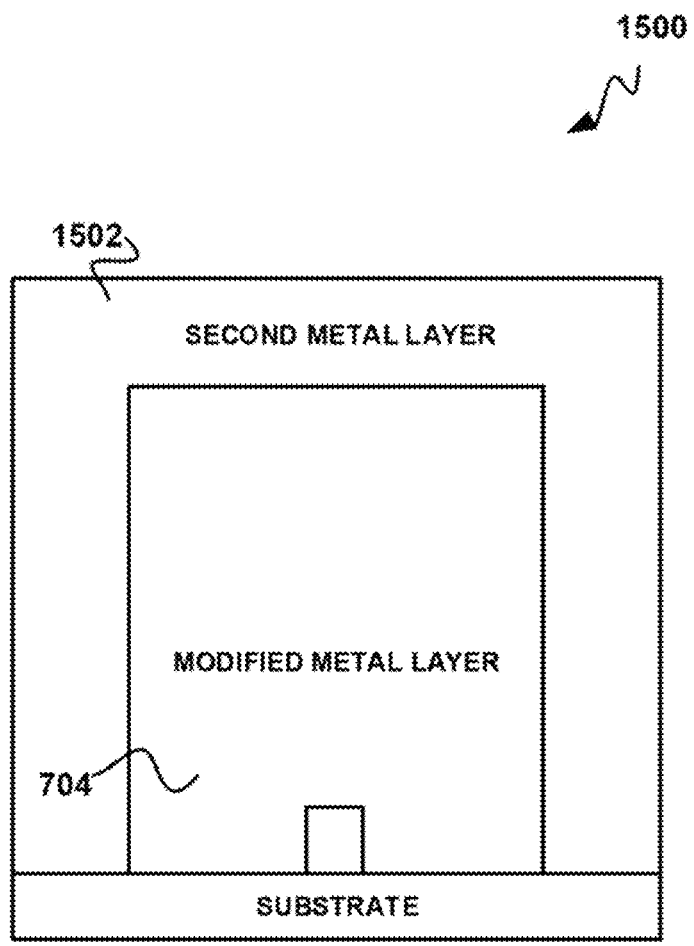
FIG. 15 illustrates an exemplary result of depositing a second metal layer over a modified metal layer, according to another embodiment.

See, for example, FIG. 15, which illustrates an exemplary result 1500 of depositing a second metal layer 1502 over the modified metal layer 704 from FIG. 7. In one embodiment, pulsed laser deposition (PLD) may be used to deposit the second metal layer (or any other metal and nonmetal materials).

Further still, as shown in operation 312, a second photoresist layer is spun over the second metal layer. In one embodiment, the photoresist layer may include a negative tone photoresist layer, a positive tone photoresist layer, etc. See, for example, FIG. 16, which illustrates an exemplary result 1600 of spin coating a photoresist layer 1602 over the second metal layer 1502 from FIG. 15.

Also, as shown in operation 314, a portion of the second photoresist layer is removed. In one embodiment, the portion of the photoresist layer may be removed by exposing the photoresist layer in a mask aligner and developing the photoresist layer. In one embodiment, exposing and developing the photoresist layer may result in the removal of a portion of the photoresist layer. In another embodiment, the removed portion may have a predetermined diameter (e.g., less than 1 mm or with a side of less than 1 mm for a rectangular structure, etc.). For example, the predetermined diameter of the removed portion may influence a fluid injection method, a final chamber sealing method, etc.

Figure 16:
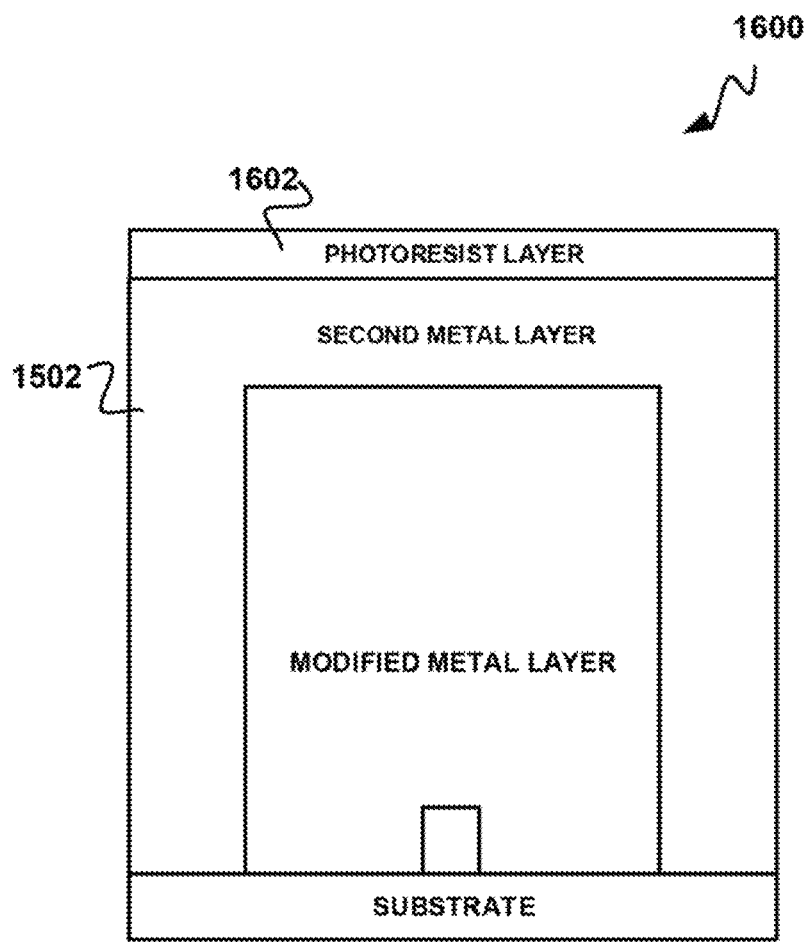
FIG. 16 illustrates an exemplary result of spin coating a photoresist layer over a second metal layer, according to another embodiment.
Figure 17:
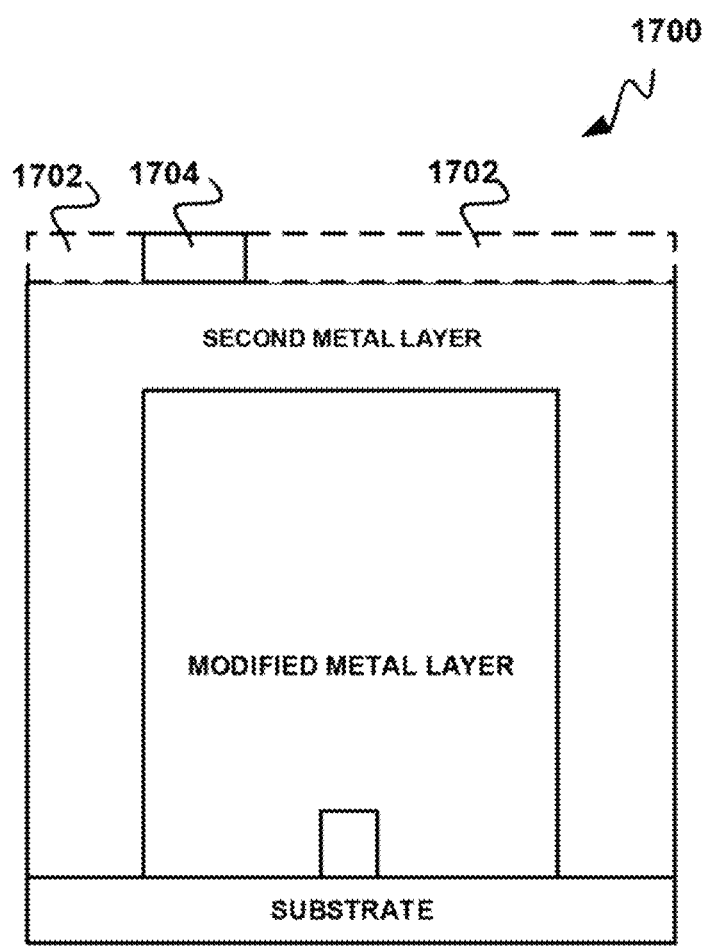
FIG. 17 illustrates an exemplary result of removing a portion of a photoresist layer to create a modified photoresist layer, according to another embodiment.

See, for example, FIG. 17, which illustrates an exemplary result 1700 of removing a portion 1702 of the photoresist layer 1602 from FIG. 16 to create a modified photoresist layer 1704.

Additionally, as shown in operation 316, a portion of the second metal layer is removed, according to the second photoresist layer. In one embodiment, the portion of the second metal layer may be removed utilizing a wet etch. See, for example, FIG. 18, which illustrates an exemplary result 1800 of removing all but a portion 1802 of the second metal layer 1502, according to the modified photoresist layer 1704 from FIG. 17.

Further, as shown in operation 318, the second photoresist layer is removed and an outer layer is deposited onto the first metal layer and second metal layer. In one embodiment, the outer layer may include polycrystalline silicon (poly-Si), silicon nitride (Si3N4), silicon dioxide (SiO2), etc. In another embodiment, the outer layer may be deposited utilizing thermal oxidation, plasma-enhanced chemical vapor deposition (PECVD), chemical vapor deposition (CVD), etc. In another embodiment, the thermal oxidation may include high temperature thermal oxidation steps. In another embodiment, a thickness of the second metal layer may be at least twice as large as a thickness of the outer layer.

Figure 18:
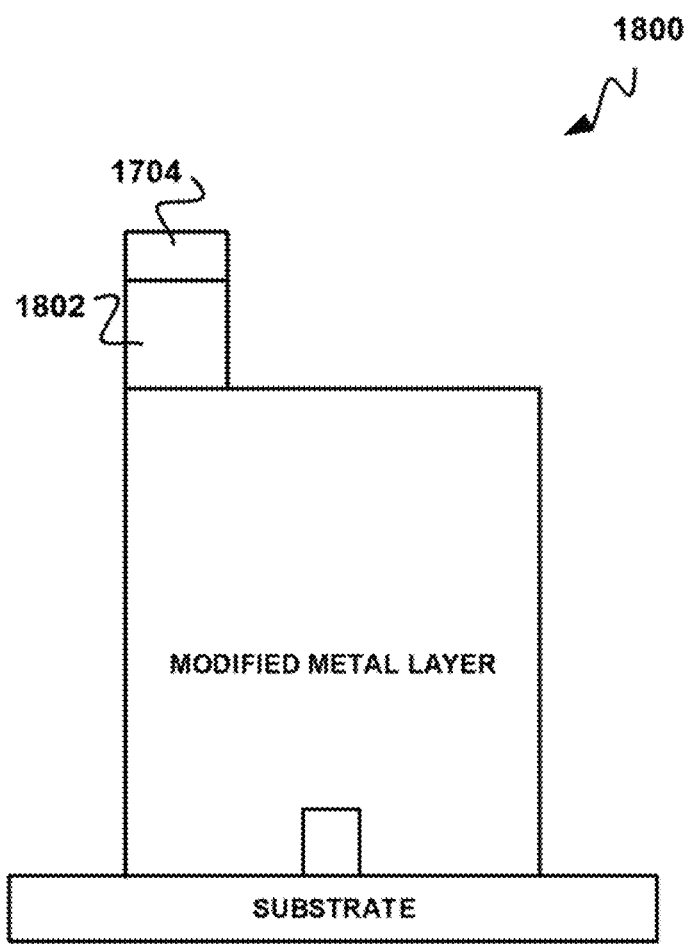
FIG. 18 illustrates an exemplary result of removing all but a portion of a second metal layer, according to a modified photoresist layer, according to another embodiment.
Figure 19:
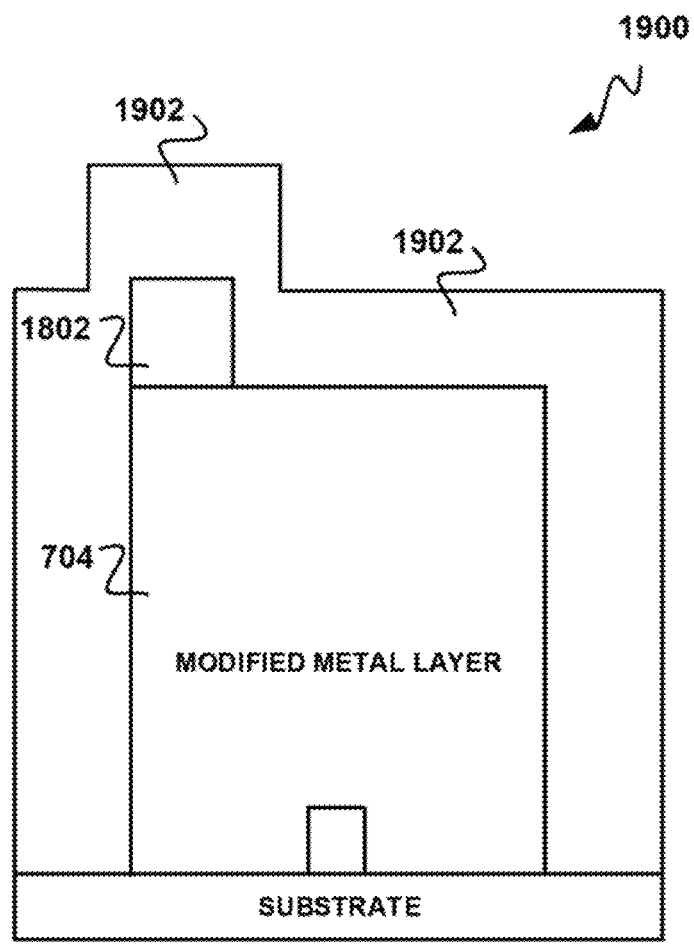
FIG. 19 illustrates an exemplary result of depositing an outer layer over a modified metal layer and a portion of a second metal layer, according to another embodiment.

See, for example, FIG. 19, which illustrates an exemplary result 1900 of depositing an outer layer 1902 over the modified metal layer 704 and the portion 1802 of the second metal layer from FIG. 18.

Figure 20:
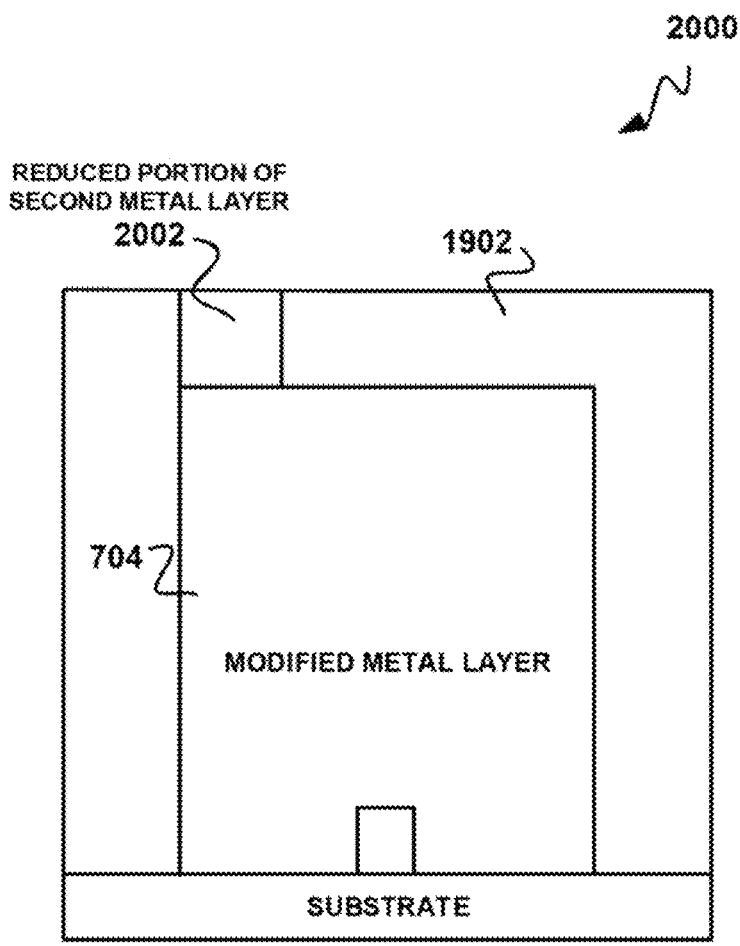
FIG. 20 illustrates an exemplary result of polishing a surface of an outer layer to reduce a size of and expose a portion of a second metal layer, according to another embodiment.

Further still, as shown in operation 320, the surface of the outer layer is planarized, exposing the second metal layer. In one embodiment, the surface of the outer layer may be planarized by polishing the surface (e.g., utilizing chemical-mechanical polishing (CMP), etc.) to make the surface planar. See, for example, FIG. 20, which illustrates an exemplary result 2000 of polishing a surface of the outer layer 1902 from FIG. 19 to reduce a size of the portion 1802 of the second metal layer from FIG. 18 to create a reduced portion 2002 of the second metal layer.

Also, as shown in operation 322, the second metal layer and the first metal layer are removed to create a chamber. For example, the second metal layer may first be removed utilizing a wet etch. In another example, the second metal layer may be removed utilizing a sonicator or other ultrasonic processing. In another embodiment, the first metal layer may be removed utilizing wet etching or dry etching. In this way, the outer layer creates the chamber for polymers or biphenyls. In another embodiment, another set of masks may be used for the second metal layer in order to implement additional process steps. See, for example, FIG. 12, which illustrates an exemplary result 1200 of removing the reduced portion 2002 of the second metal layer from FIG. 20 and the modified metal layer 704 from FIG. 7 to create a chamber 1202.

In addition, as shown in operation 324, one or more of polymers and biphenyls are back filled into the chamber. In one embodiment, the polymers and/or biphenyls may be back filled into the chamber utilizing micropipettes or other microfluidic transfer methods. In another embodiment, the polymers and/or biphenyls may be back filled into the chamber utilizing electrowetting. For example, one or more electrodes may be placed onto the CMOS during the fabrication process, and electrowetting may be implemented utilizing the electrodes.

See, for example, FIG. 13, which illustrates an exemplary result 1300 of filling the chamber 1202 from FIG. 12 with polymers and/or biphenyls 1302.

Furthermore, as shown in operation 326, the chamber is sealed. In one embodiment, the chamber may be sealed using room temperature silicon dioxide ($SiO_2$) wafer bonding by an adhesion layer method. In another embodiment, the chamber may be sealed using a flowable oxide resist (such as FOX® 25 Flowable oxide sold by Dow Corning Corporation of Auburn, Mich. etc. For example, the flowable oxide may be spun onto the top of the chamber (e.g., at a speed of 1000 RPM), exposed, and developed. In another example, the exposure may be an area exposure and may not require a mask. In yet another embodiment, the chamber may be sealed using room temperature oxygen plasma. In still another embodiment, using SiO2 wafer bonding or oxygen plasma sealing methods, the chamber may be sealed using a cover plate such as a microscope cover glass (e.g., having a thickness of 0.13-0.17 mm, etc.).

See, for example, FIG. 14, which illustrates an exemplary result 1400 of adding a seal 1402 to the chamber 1202 from FIG. 12.

In this way, wet etching may enable the use of simple, low cost equipment, and may have a high throughput (e.g., utilizing a batch process, etc.) and high etch rate. Additionally, high selectivity may also be possible.

It will be understood that many additional changes in the details, materials, steps and arrangement of parts, which have been herein described and illustrated to explain the nature of the invention, may be made by those skilled in the art within the principle and scope of the invention as expressed in the appended claims.

The foregoing description of various embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. A method, comprising:
   creating a chamber on a semiconductor substrate utilizing dry etching, including:
      forming a metal layer on top of the semiconductor substrate,
      spin coating a first photoresist layer onto the metal layer,
      removing a portion of the first photoresist layer to create a modified first photoresist layer,
      removing one or more portions of the metal layer, according to the modified first photoresist layer,
      depositing an outer layer onto the metal layer,
      spin coating a second photoresist layer over the outer layer,
      removing a portion of the second photoresist layer to create a modified second photoresist layer,
      removing a portion of the outer layer, according to the modified second photoresist layer, and
      removing the second photoresist layer and the metal layer to create the chamber;
   back-filling the chamber with a polymeric compound; and
   sealing the chamber.

2. The method of claim 1, wherein the metal layer is formed over a silicon structure area patterned onto the semiconductor substrate.

3. The method of claim 1, wherein the semiconductor includes a complementary metal oxide semiconductor (CMOS).

4. The method of claim 1, wherein the polymeric compound includes a biphenyl or other negative thermo-optic material.

5. The method of claim 1, wherein the back-filling is performed utilizing one or more micropipettes.

6. The method of claim 1, wherein the back-filling is performed utilizing electrowetting.

7. The method of claim 1, wherein the chamber is sealed utilizing wafer bonding.

8. The method of claim 1, wherein the chamber is sealed utilizing a flowable oxide.

9. The method of claim 1, wherein the chamber is sealed utilizing oxygen plasma.

10. The method of claim 1, wherein the chamber is created utilizing a back end of line (BEOL) complementary metal oxide semiconductor (CMOS) fabrication process.

11. A method, comprising:
   creating a chamber on a semiconductor substrate utilizing wet etching, including:
      forming a first metal layer on top of the semiconductor substrate,
      spin coating a first photoresist layer onto the first metal layer,
      removing a portion of the first photoresist layer to create a modified first photoresist layer,
      removing one or more portions of the first metal layer, according to the modified first photoresist layer,
      depositing a second metal layer onto the first metal layer,
      spin coating a second photoresist layer over the second metal layer,
      removing a portion of the second photoresist layer to create a modified second photoresist layer,
      removing a portion of the second metal layer, according to the modified second photoresist layer,
      removing the second photoresist layer,
      depositing an outer layer onto the first metal layer and the second metal layer,
      planarizing a surface of the outer layer, and removing the second metal layer and the first metal layer to create the chamber;

back-filling the chamber with a polymeric compound; and sealing the chamber.

12. The method of claim 11, wherein the first metal layer is formed over a silicon structure area patterned onto the semiconductor substrate.

13. The method of claim 11, wherein the semiconductor includes a complementary metal oxide semiconductor (CMOS).

14. The method of claim 11, wherein the polymeric compound includes a biphenyl or other negative thermo-optic material.

15. The method of claim 11, wherein the back-filling is performed utilizing one or more micropipettes.

16. The method of claim 11, wherein the back-filling is performed utilizing electrowetting.

17. The method of claim 11, wherein the chamber is sealed utilizing wafer bonding.

18. The method of claim 11, wherein the chamber is sealed utilizing a flowable oxide.

19. The method of claim 11, wherein the chamber is sealed utilizing oxygen plasma.

* * * * *